United States Patent
Chen et al.

(10) Patent No.: US 8,083,961 B2
(45) Date of Patent: Dec. 27, 2011

(54) METHOD AND SYSTEM FOR CONTROLLING THE UNIFORMITY OF A BALLISTIC ELECTRON BEAM BY RF MODULATION

(75) Inventors: Lee Chen, Cedar Creek, TX (US); Ping Jiang, Plano, TX (US)

(73) Assignees: Tokyo Electron Limited, Tokyo (JP); Texas Instruments Incorporated, Dallas, TX (US)

( * ) Notice: Subject to any disclaimer, the term of this patent is extended or adjusted under 35 U.S.C. 154(b) by 796 days.

(21) Appl. No.: 11/495,726

(22) Filed: Jul. 31, 2006

(65) Prior Publication Data

US 2008/0023440 A1    Jan. 31, 2008

(51) Int. Cl.
*B44C 1/22* (2006.01)
*C23F 1/00* (2006.01)
*G01L 21/30* (2006.01)

(52) U.S. Cl. ............... 216/61; 216/58; 216/59; 216/67; 438/706; 438/710; 156/345.24; 156/345.47

(58) Field of Classification Search .............. 216/58, 216/59, 61, 67; 438/706.71; 156/345.24, 156/345.47

See application file for complete search history.

(56) References Cited

U.S. PATENT DOCUMENTS

| | | | |
|---|---|---|---|
| 6,030,667 A * | 2/2000 | Nakagawa et al. | 427/569 |
| 2002/0041160 A1* | 4/2002 | Barnes et al. | 315/111.21 |
| 2003/0207583 A1* | 11/2003 | Kuthi et al. | 438/714 |
| 2005/0241762 A1* | 11/2005 | Paterson et al. | 156/345.28 |
| 2006/0037701 A1* | 2/2006 | Koshiishi et al. | 156/345.44 |

* cited by examiner

*Primary Examiner* — Shamim Ahmed

(74) *Attorney, Agent, or Firm* — Oblon, Spivak, McClelland, Maier & Neustadt, L.L.P.

(57) ABSTRACT

A method and system for treating a substrate using a ballistic electron beam is described, whereby the radial uniformity of the electron beam flux is adjusted by modulating the source radio frequency (RF) power. For example, a plasma processing system is described having a first RF power coupled to a lower electrode, which may support the substrate, a second RF power coupled to an upper electrode that opposes the lower electrode, and a negative high voltage direct current (DC) power coupled to the upper electrode to form the ballistic electron beam. The amplitude of the second RF power is modulated to affect changes in the uniformity of the ballistic electron beam flux.

17 Claims, 9 Drawing Sheets

METHOD AND SYSTEM FOR CONTROLLING THE UNIFORMITY OF A BALLISTIC ELECTRON BEAM BY RF MODULATION

BACKGROUND OF THE INVENTION

1. Field of Invention

The present invention relates to a method and apparatus for plasma processing a substrate, and more particularly to a method and system for modulating power during plasma processing in order to adjust process uniformity.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure.

Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k and ultra low-k dielectric materials, poly-silicon, silicon carbide, and silicon nitride.

SUMMARY OF THE INVENTION

The present invention relates to a method and system for etching a substrate.

According to one embodiment, a method and system is described for etching a substrate using plasma enhanced by a ballistic electron beam.

According to another embodiment, a method and system is described for adjusting the spatial distribution of electron beam flux in a ballistic electron beam enhanced plasma etching process.

According to another embodiment, a method for treating, and a computer readable medium with program instructions to cause a computer system to control a plasma process system having a ballistic electron beam to etch a thin film on a substrate is described, comprising: disposing the substrate on a substrate holder in the plasma processing system; coupling direct current (DC) power to an electrode within the plasma processing system in order to create the ballistic electron beam; coupling alternating current (AC) power to the electrode or the substrate holder or both in order to form plasma in the plasma processing system; modulating the amplitude of the AC power in order to adjust the spatial distribution of electron beam flux for the ballistic electron beam; and etching the thin film with the plasma and the ballistic electron beam.

According to yet another embodiment, a plasma processing system configured to etch a substrate is described, comprising: a plasma processing chamber configured to facilitate the formation of plasma; a substrate holder coupled to the plasma processing chamber and configured to support the substrate; an electrode coupled to the plasma processing chamber and configured to contact the plasma; an AC power system coupled to the plasma processing chamber, and configured to couple at least one AC signal to the substrate holder or the electrode or both in order to form the plasma; a DC power system coupled to the plasma processing chamber and configured to couple a DC voltage to the electrode in order to form a ballistic electron beam through the plasma; and an AC power modulation system coupled to the AC power system and configured to modulate the amplitude of one or more of the at least one AC signal in order to adjust the spatial distribution of the electron beam flux for the ballistic electron beam.

According to yet another embodiment, a plasma processing system configured to etch a substrate is described, comprising: a plasma processing chamber configured to facilitate the formation of plasma; a substrate holder coupled to the plasma processing chamber and configured to support the substrate; means for coupling AC power to the plasma processing chamber in order to form the plasma; means for coupling DC power to the plasma processing system in order to form a ballistic electron beam through the plasma; and means for modulating the amplitude of the AC power in order to adjust the spatial distribution of the electron beam flux for the ballistic electron beam.

DETAILED DESCRIPTION OF PREFERRED EMBODIMENTS

In the following description, for purposes of explanation and not limitation, specific details are set forth, such as a particular geometry of the plasma processing system and descriptions of various processes. However, it should be understood that the invention may be practiced in other embodiments that depart from these specific details.

In material processing methodologies, pattern etching comprises the application of a thin layer of light-sensitive material, such as photoresist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent. Moreover, this mask layer may comprise multiple sub-layers.

During pattern etching, a dry plasma etching process is often utilized, wherein plasma is formed from a process gas by coupling electromagnetic (EM) energy, such as radio frequency (RF) power, to the process gas in order to heat electrons and cause subsequent ionization and dissociation of the atomic and/or molecular composition of the process gas. Furthermore, negative, high voltage direct current (DC) electrical power can be coupled to the plasma processing system in order to create a ballistic electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701 A1; the entire contents of which are herein incorporated by reference in their entirety.

Figure 1:
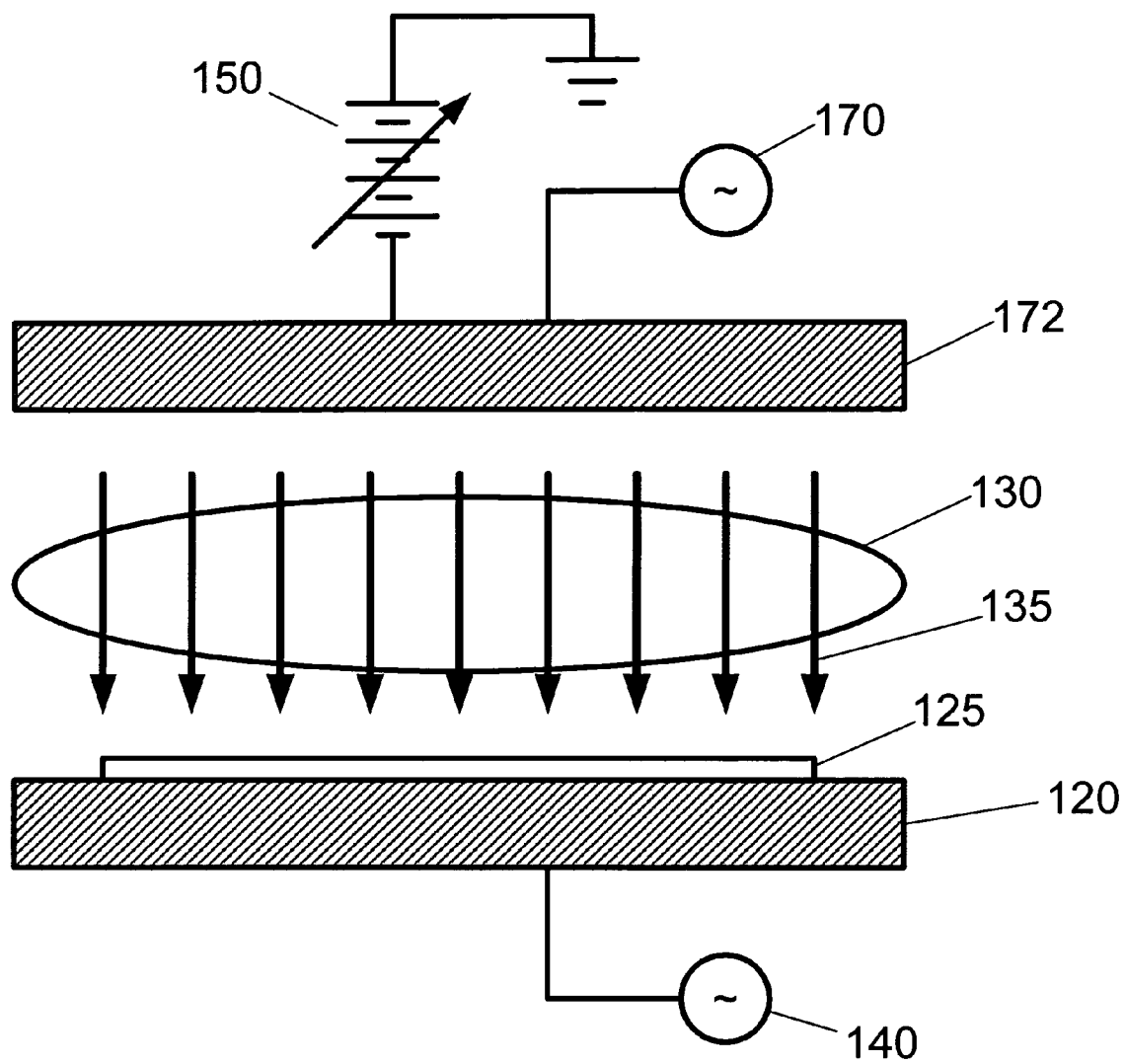
FIG. 1 presents a schematic representation of a plasma processing system according to an embodiment of the invention.

Referring now to FIG. 1, a schematic illustration of a plasma processing system incorporating a ballistic electron beam is provided. The plasma processing system comprises a first electrode 120 and a second electrode 172 disposed opposite each other within a process chamber, wherein the first electrode 120 is configured to support a substrate 125. The first electrode 120 is coupled to a first RF generator 140 configured to provide RF power at a first RF frequency, while the second electrode 172 is coupled to a second RF generator 170 configured to provide RF power at a second RF frequency. For example, the second RF frequency can be at a relatively higher RF frequency than the first RF frequency. The coupling of RF power to the first and second electrodes facilitates the formation of plasma 130. Additionally, the plasma processing system comprises a DC power supply 150 configured to provide a DC voltage to the second electrode 172. Here, the coupling of a negative DC voltage to the second electrode 172 facilitates the formation of ballistic electron beam 135. The electron beam power is derived from the superposition of the negative DC voltage on the second electrode 172. As is described in published US patent application no. 2006/0037701A1, the application of negative DC power to the plasma processing system affects the formation of a ballistic (or collision-less) electron beam that strikes the surface of substrate 125.

In general, the ballistic electron beam can be implemented with any type of plasma processing system, as will be shown below. In this example, the negative DC voltage is superimposed on a RF powered capacitively coupled plasma (CCP) processing system. Hence, the invention is not to be limited by this example. It is merely utilized for illustration purposes.

While the ballistic electron beam is important for enhancing etch properties, the uniformity of the electron beam flux $I_e(r)$ is also important. Although the electron beam is collision-less, it can transfer energy to the plasma via known physical phenomena, resulting in an increase in the bulk plasma density. One possible theory for the transfer of energy from the electron beam into the bulk plasma and its subsequent ionization may be a dual-stream plasma instability that couples the run-away electron beam energy into the ion wave. Therein, the bulk Boltzmann electrons of a particular energy group are electrostatically accelerated by the ion wave (gaining energy through Landau clamping) to a higher energy that subsequently ionizes neutral species. The source of electrons for the ballistic electron beam is secondary electrons generated from the ion bombardment of the second electrode 172. Therefore, the uniformity of the ballistic electron beam flux to substrate 125 depends upon the uniformity of the plasma and ion flux to electrode 172, as well as other parameters.

The collision-less electron beam flux $I_e(r)$ can be expressed as:

$$I_e(r) \sim v_{B1} n_e(r)[V_p(r)-V(r)]^{3/2}, \qquad (1)$$

where $v_{B1}$ represents the ion Bohm velocity at electrode 172, $V_p(r)$ represents the radial variation of the plasma potential, $V(r)$ represents the radial variation of the electrode potential (i.e., second electrode 172), and $n_e(r)$ represents the radial variation of the electron density (or bulk plasma density) at the edge of the sheath at the second electrode 172. Typically, it is a very reasonable to assume a radially constant $V_p(r)$ at the edge of the sheath at the second electrode 172. Therefore, the electron beam flux $I_e(r)$ is predominantly affected by the (sheath-edge) electron density $n_e(r)$ (which is driven by stochastic heating at the second electrode 172) and the electrode potential $V(r)$.

Figure 2:
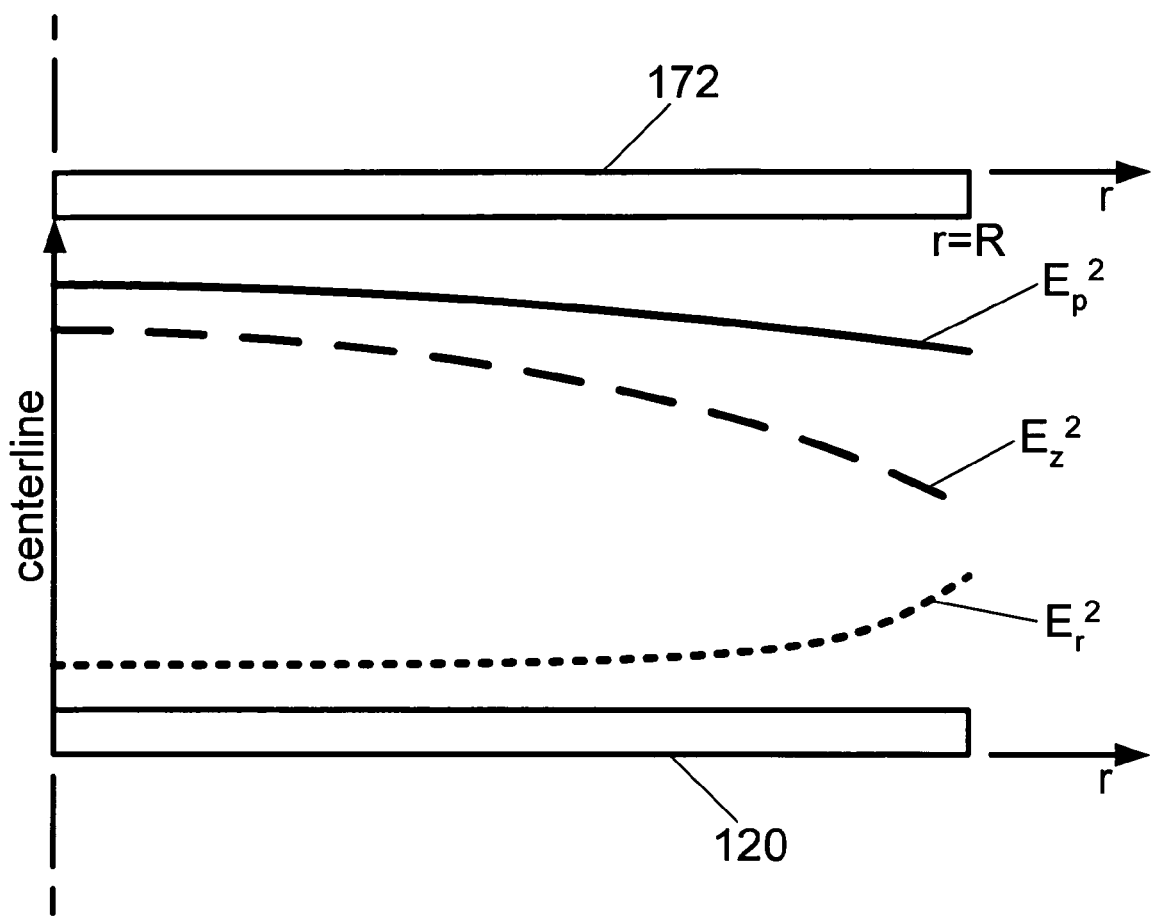
FIG. 2 presents exemplary radial distributions of power density for a capacitively coupled plasma processing system.

As an example, the behavior of the electrode potential $V(r)$, the RF current $I_{RF}(r)$ and the resultant electron density $n_e(r)$ in a high frequency capacitive discharge is described in "Standing wave and skin effects in large-area, high frequency capacitive discharges" (M. A. Lieberman, J. P. Booth, P. Chabert, J. M. Rax, & M. M. Turner, Plasma Sources Sci. Technol., 11, 2002, 283-293). This behavior is summarized in FIG. 2. At high VHF (very high frequency) power (i.e., high density), the inductive power ($E_r^2$) dominates, whereas at low VHF power (i.e., lower density), the capacitive ($E_z^2$) power dominates.

Therefore, according to an embodiment, VHF (RF power) amplitude modulation is utilized to alternate between $E_r^2$-domination and $E_z^2$-domination. In doing so, a prescribed distribution of $n_e(r)$ and $V(r)$ can be achieved, while maintaining a substantially similar total power deposition into plasma 130 (per the process recipe). RF power modulation can provide a means for adjusting the spatial uniformity of the plasma density $n_e(r)$ and, hence, the electron beam flux $I_e(r)$.

Figure 3:
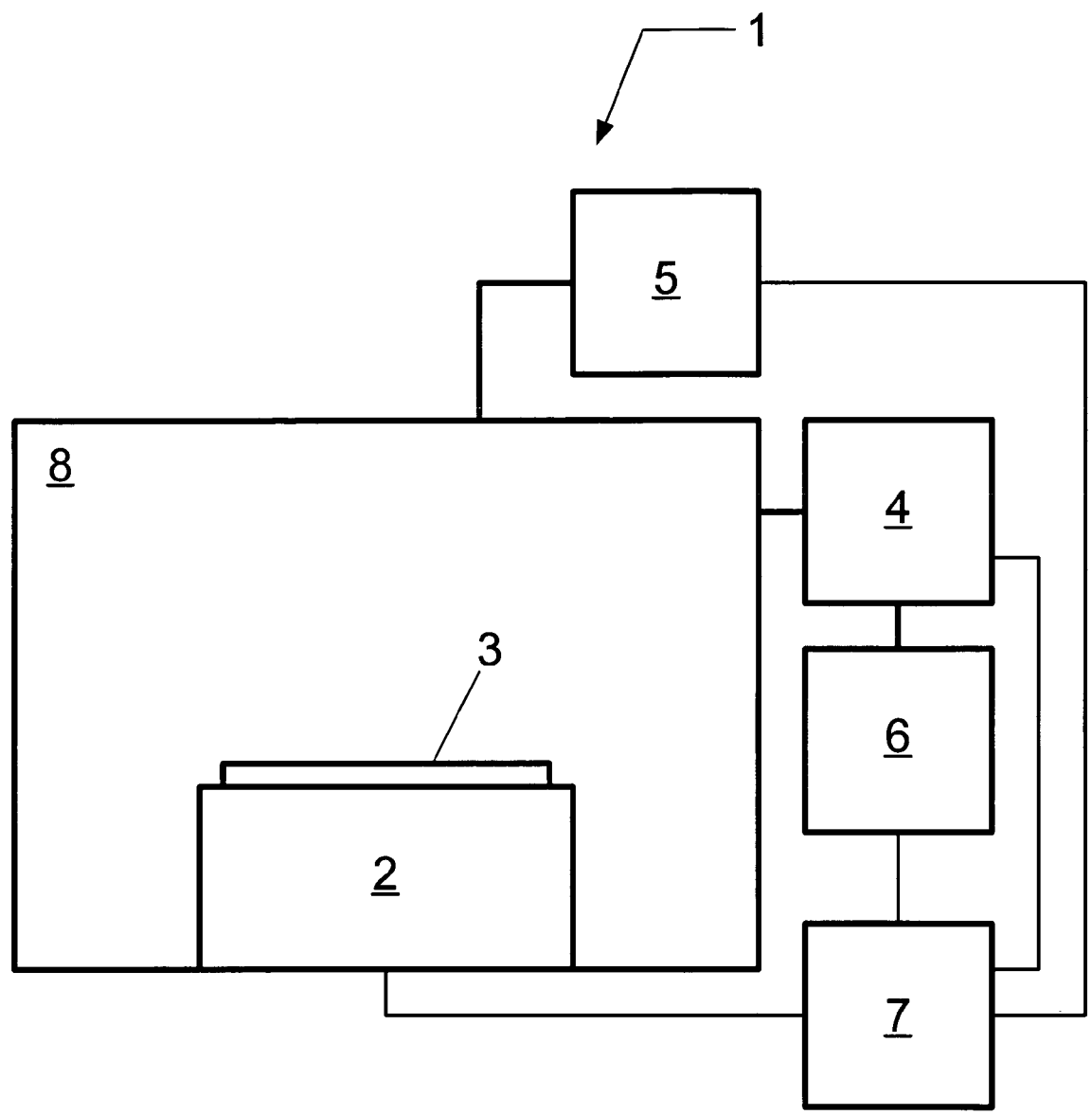
FIG. 3 shows a schematic diagram of a plasma processing system according to another embodiment of the invention.

Referring now to FIG. 3, a plasma processing system configured to provide means for adjusting the spatial uniformity of a ballistic electron beam flux is presented according to one embodiment. Plasma processing system 1 comprises a plasma processing chamber 8 configured to facilitate the formation of plasma, a substrate holder 2 coupled to the plasma processing chamber 8 and configured to support the substrate 3, and an electrode coupled to the plasma processing chamber 8 and configured to contact the plasma. Additionally, plasma processing system 1 comprises an AC power system 4 coupled to the plasma processing chamber 8 and configured to couple at least one AC signal to the substrate holder 2 or the electrode or both in order to form the plasma, and a DC power system 5 coupled to the plasma processing chamber 8 and configured to couple a DC voltage to the electrode in order to form a ballistic electron beam through the plasma. Furthermore, plasma processing system 1 comprises an AC power modulation system 6 coupled to the AC power system 5 and configured to modulate the amplitude of one or more of the at least one AC signal in order to adjust the spatial distribution of the electron beam flux for the ballistic electron beam. Optionally, plasma processing system 1 further comprises a controller 7 coupled to plasma processing chamber 8, substrate holder 2, AC power system 4, DC power system 5 and AC power modulation system 6, and configured to exchange data with each of these components in order to execute a process within the plasma processing chamber 8 to treat substrate 3.

Figure 4:
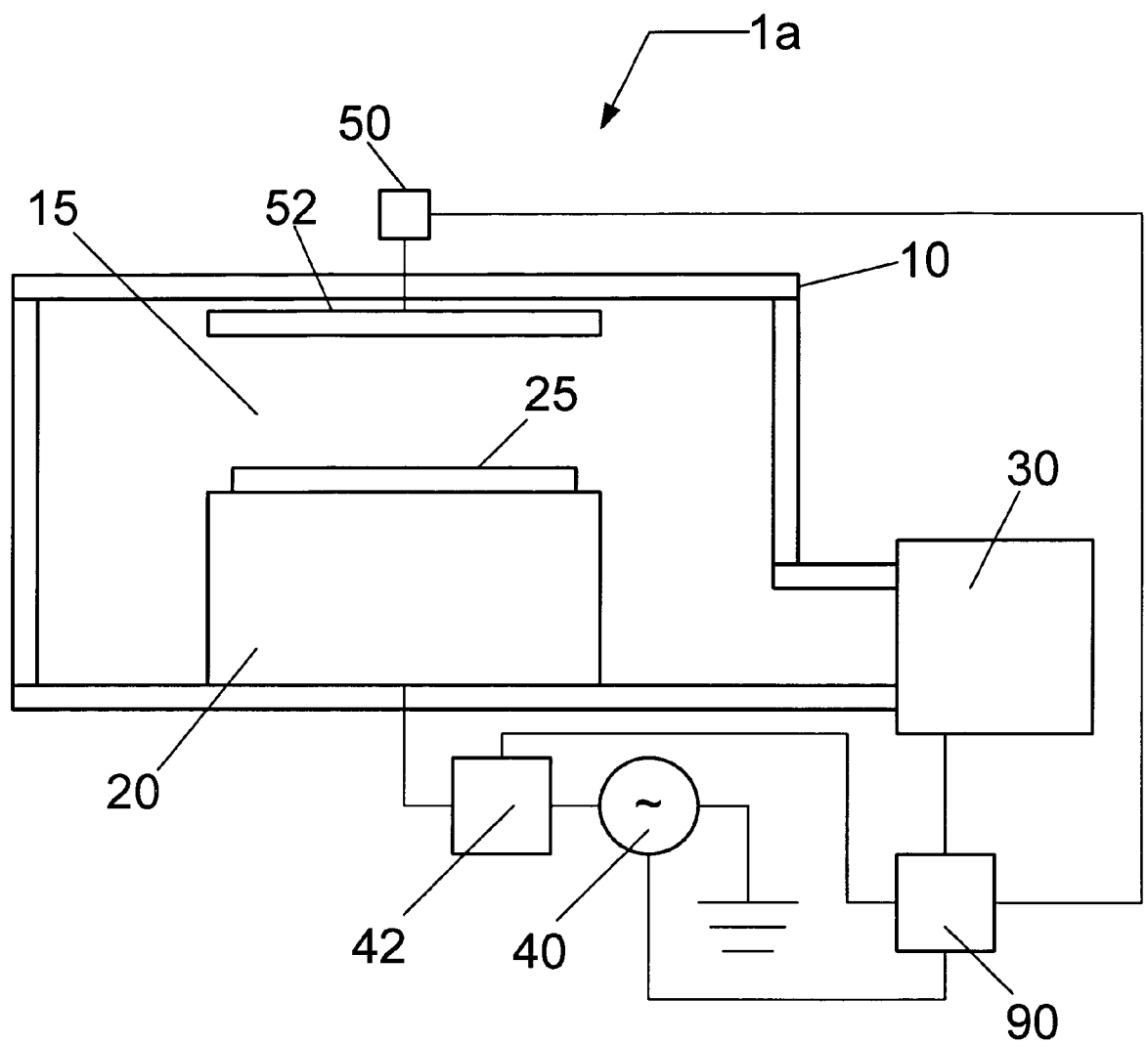
FIG. 4 shows a schematic diagram of a plasma processing system according to another embodiment of the invention.

FIG. 4 illustrates a plasma processing system according to another embodiment. Plasma processing system 1a comprising a plasma processing chamber 10, substrate holder 20, upon which a substrate 25 to be processed is affixed, and vacuum pumping system 30. Substrate 25 can be a semiconductor substrate, a wafer or a liquid crystal display. Plasma processing chamber 10 can be configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process a substrate of any size, such as 200 mm substrates, 300 mm substrates, or larger.

Substrate 25 can be affixed to the substrate holder 20 via an electrostatic clamping system. Furthermore, substrate holder 20 can further include a cooling system or heating system that includes a re-circulating fluid flow that receives heat from substrate holder 20 and transfers heat to a heat exchanger system (not shown) when cooling, or transfers heat from the heat exchanger system to the fluid flow when heating. Moreover, gas can be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 25. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

In the embodiment shown in FIG. 4, substrate holder 20 can comprise an electrode through which RF power is coupled to the processing plasma in process space 15. For example, substrate holder 20 can be electrically biased at a RF voltage via the transmission of RF power from a RF generator 40 through an optional impedance match network 42 to substrate holder 20. The RF bias can serve to heat electrons to form and maintain plasma, or affect the ion energy distribution function within the sheath, or both. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Furthermore, the amplitude of the RF power coupled to substrate holder 20 is modulated in order to affect changes in the spatial distribution of the electron beam flux to substrate 25. RF generator 40 can comprise an oscillator configured to generate an RF signal (or oscillator signal) at an RF frequency as described above, and an amplifier configured to amplify the RF signal and modulate the amplitude of the RF signal according to an amplitude modulation signal from a waveform signal generator. For example, the amplifier can include a linear RF amplifier suitable for receiving an oscillator signal from the oscillator and an amplitude modulation signal from the waveform signal generator. One example of an amplitude modulation signal output from the waveform signal generator is a pulse waveform. Another example of an amplitude modulation signal output from the waveform signal generator is a sinusoidal waveform.

An exemplary system including the amplifier and an internal signal generator is a commercially available linear RF amplifier (Model line LPPA) from Dressier (2501 North Rose Drive, Placentia, Calif. 92670). The above amplifier is capable of operating in continuous mode as well as pulse mode with RF powers ranging from 400 to 8000 watts (W) at frequencies ranging from 10 to 500 MHz. Moreover, the above amplifier can achieve pulse widths as short as 20 milliseconds.

Furthermore, impedance match network 42 serves to improve the transfer of RF power to plasma in plasma processing chamber 10 by reducing the reflected power. Match network topologies (e.g. L-type, π-type, T-type, etc.) and automatic control methods are well known to those skilled in the art.

Referring still to FIG. 4, plasma processing system 1a further comprises a direct current (DC) power supply 50 coupled to an upper electrode 52 opposing substrate 25. The upper electrode 52 may comprise an electrode plate. The electrode plate may comprise a silicon-containing electrode plate. Moreover, the electrode plate may comprise a doped silicon electrode plate. The DC power supply can include a variable DC power supply. Additionally, the DC power supply can include a bipolar DC power supply. The DC power supply 50 can further include a system configured to perform at least one of monitoring adjusting, or controlling the polarity, current, voltage, or on/off state of the DC power supply 50. Once plasma is formed, the DC power supply 50 facilitates the formation of a ballistic electron beam. An electrical filter may be utilized to de-couple RF power from the DC power supply 50.

For example, the DC voltage applied to electrode 52 by DC power supply 50 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 52. The surface of the upper electrode 52 facing the substrate holder 20 may be comprised of a silicon-containing material.

Vacuum pump system 30 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Referring still to FIG. 4, plasma processing system 1a further comprises a controller 90 that comprises a microprocessor, memory, and a digital I/O port capable of generating control voltages sufficient to communicate and activate inputs to plasma processing system 1a as well as monitor outputs from plasma processing system 1a. Moreover, controller 90 can be coupled to and can exchange information with RF generator 40, impedance match network 42, DC power supply 50, the gas injection system (not shown), vacuum pumping system 30, as well as the backside gas delivery system (not shown), the substrate/substrate holder temperature measurement system (not shown), and/or the electrostatic clamping system (not shown). A program stored in the memory can be utilized to activate the inputs to the aforementioned components of plasma processing system 1a according to a process recipe in order to perform the method of etching a thin film. One example of controller 90 is a DELL PRECISION WORKSTATION 610™, available from Dell Corporation, Austin, Tex.

Controller 90 may be locally located relative to the plasma processing system 1a, or it may be remotely located relative to the plasma processing system 1a via an internet or intranet. Thus, controller 90 can exchange data with the plasma processing system 1a using at least one of a direct connection, an intranet, or the internet. Controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, or the internet.

In the embodiment shown in FIG. 5, the plasma processing system 1b can be similar to the embodiment of FIG. 3 or 4 and further comprise either a stationary, or mechanically or electrically rotating magnetic field 60, in order to potentially increase plasma density and/or improve plasma processing uniformity, in addition to those components described with reference to FIG. 3. Moreover, controller 90 can be coupled to magnetic field system 60 in order to regulate the speed of rotation and field strength. The design and implementation of a rotating magnetic field is well known to those skilled in the art.

Figure 6:
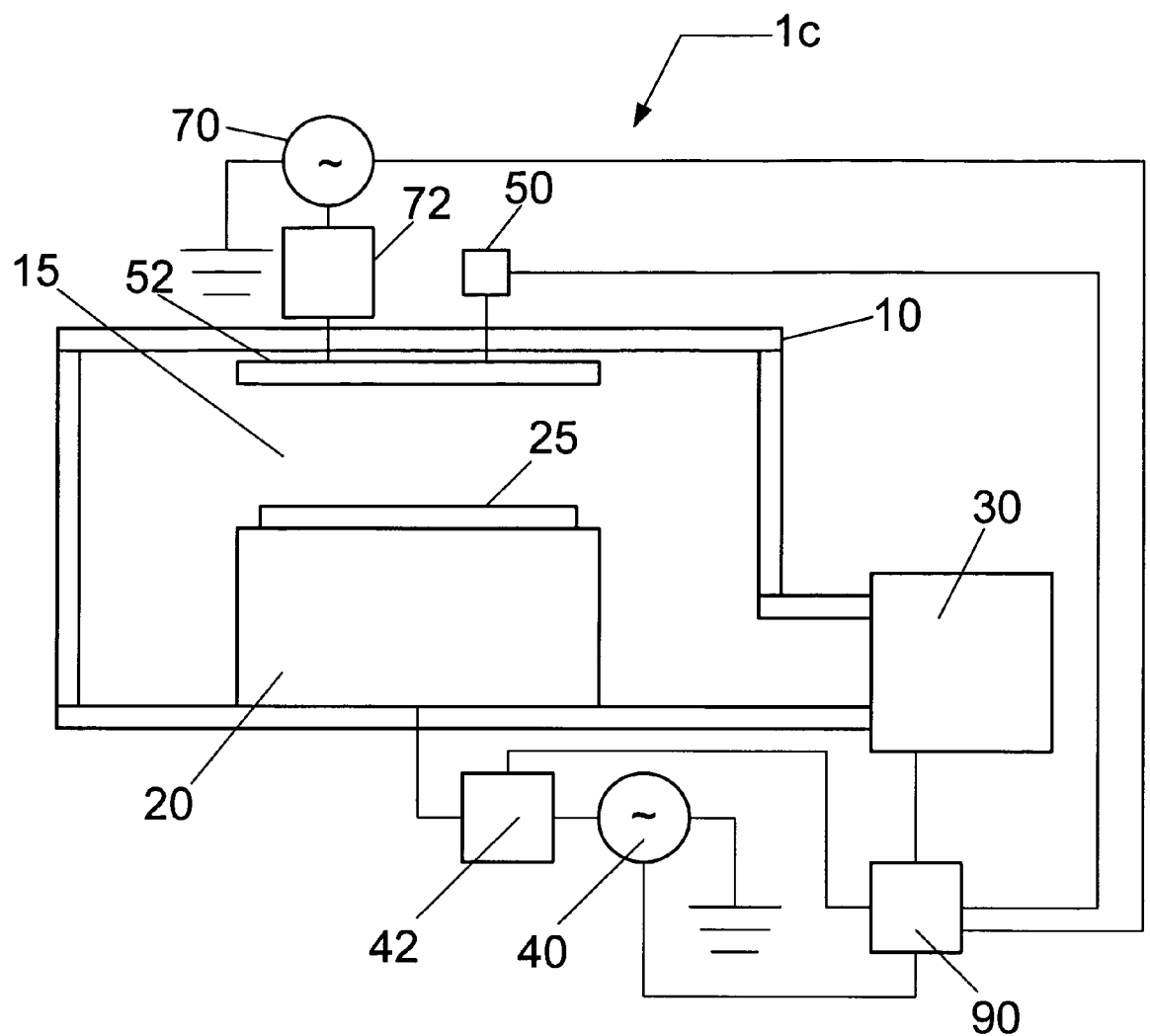
FIG. 6 shows a schematic diagram of a plasma processing system according to another embodiment of the invention.

In the embodiment shown in FIG. 6, the plasma processing system 1c can be similar to the embodiment of FIG. 3 or FIG. 4, and can further comprise an RF generator 70 configured to couple RF power to upper electrode 52 through an optional impedance match network 72. A typical frequency for the application of RF power to upper electrode 52 can range from about 0.1 MHz to about 200 MHz. Additionally, a typical frequency for the application of power to the substrate holder 20 (or lower electrode) can range from about 0.1 MHz to about 100 MHz. For example, the RF frequency coupled to the upper electrode 52 can be relatively higher than the RF frequency coupled to the substrate holder 20. Furthermore, the RF power to the upper electrode 52 from RF generator 70 can be amplitude modulated, or the RF power to the substrate holder 20 from RF generator 40 can be amplitude modulated, or both RF powers can be amplitude modulated. Desirably, the RF power at the higher RF frequency is amplitude modulated. Moreover, controller 90 is coupled to RF generator 70 and impedance match network 72 in order to control the application of RF power to upper electrode 70. The design and implementation of an upper electrode is well known to those skilled in the art.

Referring still to FIG. 6, the DC power supply 50 may be directly coupled to upper electrode 52, or it may be coupled to the RF transmission line extending from an output end of impedance match network 72 to upper electrode 52. An electrical filter may be utilized to de-couple RF power from DC power supply 50.

Figure 5:
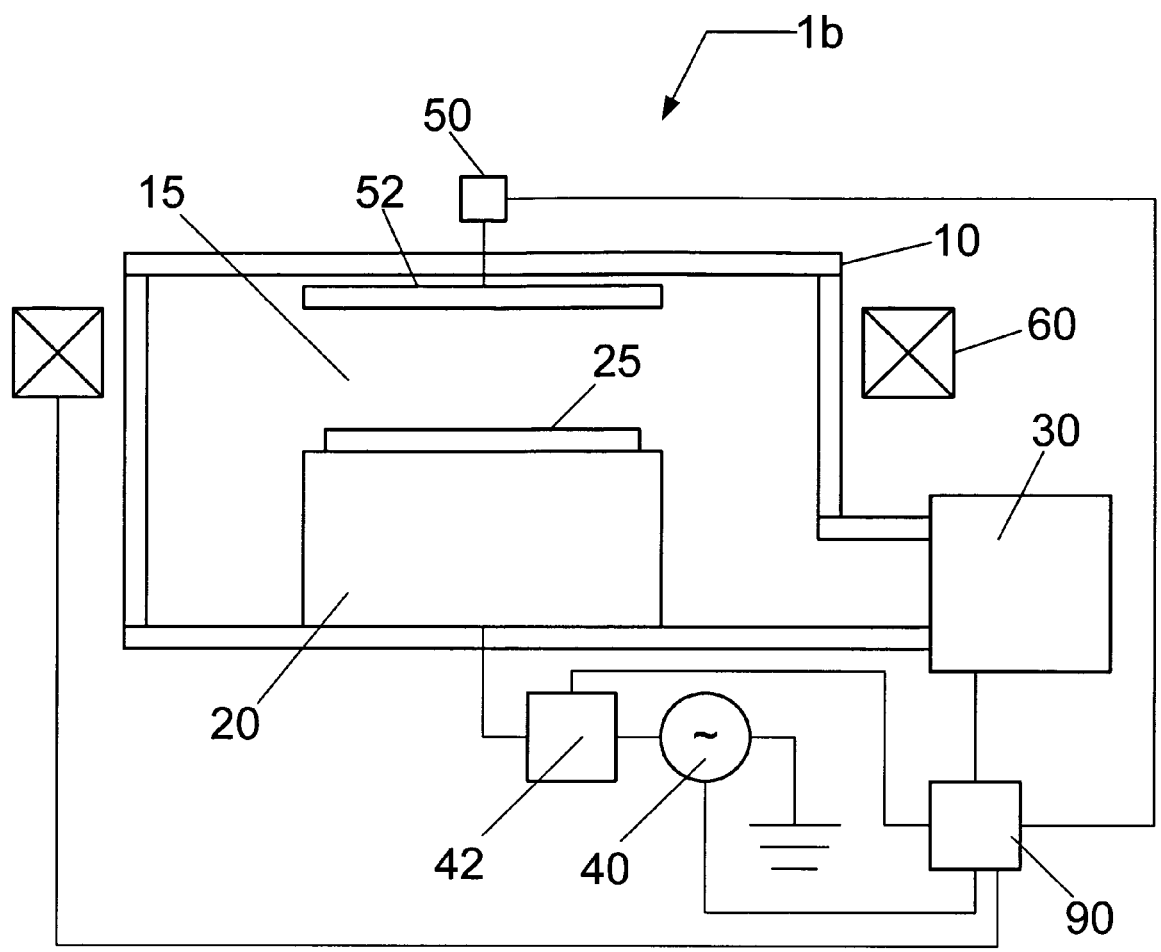
FIG. 5 shows a schematic diagram of a plasma processing system according to another embodiment of the invention.
Figure 7:
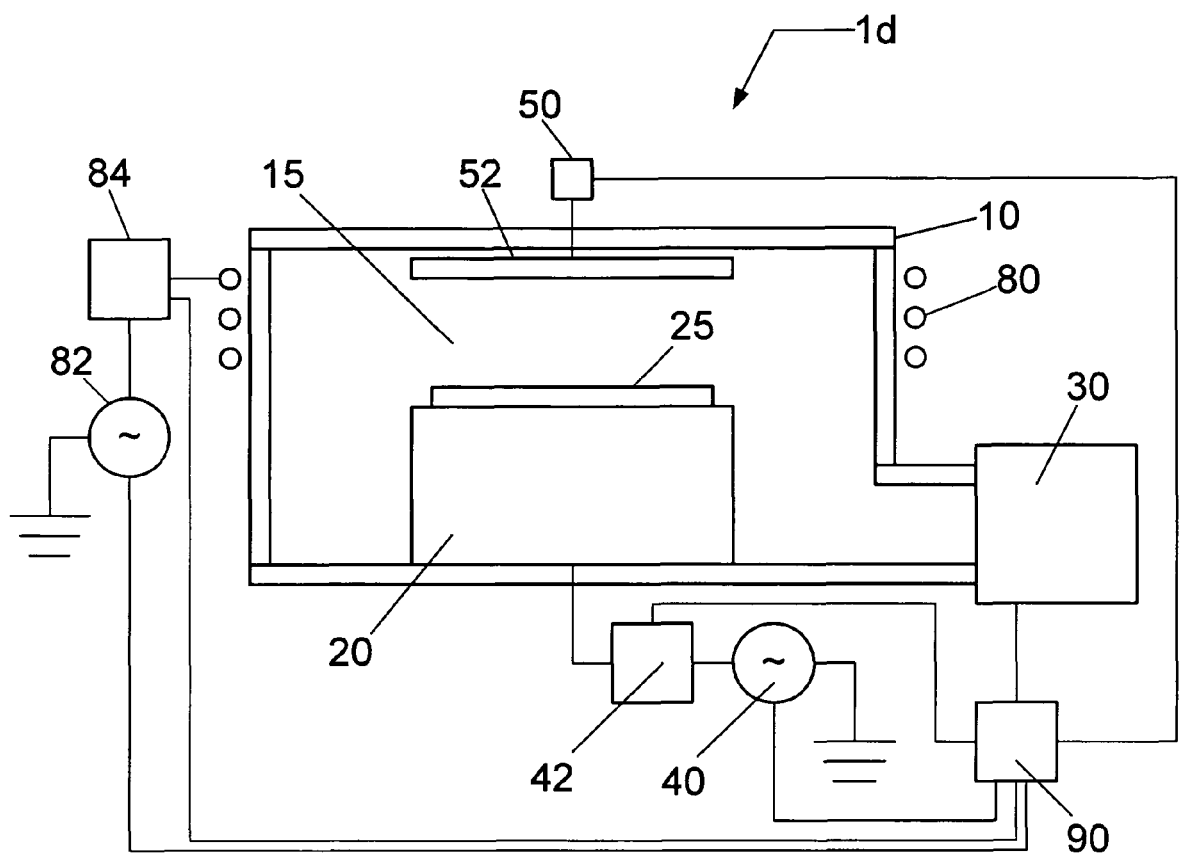
FIG. 7 shows a schematic diagram of a plasma processing system according to another embodiment of the invention.

In the embodiment shown in FIG. 7, the plasma processing system 1d can, for example, be similar to the embodiments of FIGS. 3, 4 and 5, and can further comprise an inductive coil 80 to which RF power is coupled via RF generator 82 through an optional impedance match network 84. RF power is inductively coupled from inductive coil 80 through a dielectric window (not shown) to plasma processing region 15. A typical frequency for the application of RF power to the inductive coil 80 can range from about 10 MHz to about 100 MHz. Similarly, a typical frequency for the application of power to the chuck electrode can range from about 0.1 MHz to about 100 MHz. In addition, a slotted Faraday shield (not shown) can be employed to reduce capacitive coupling between the inductive coil 80 and plasma. Moreover, controller 90 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 8:
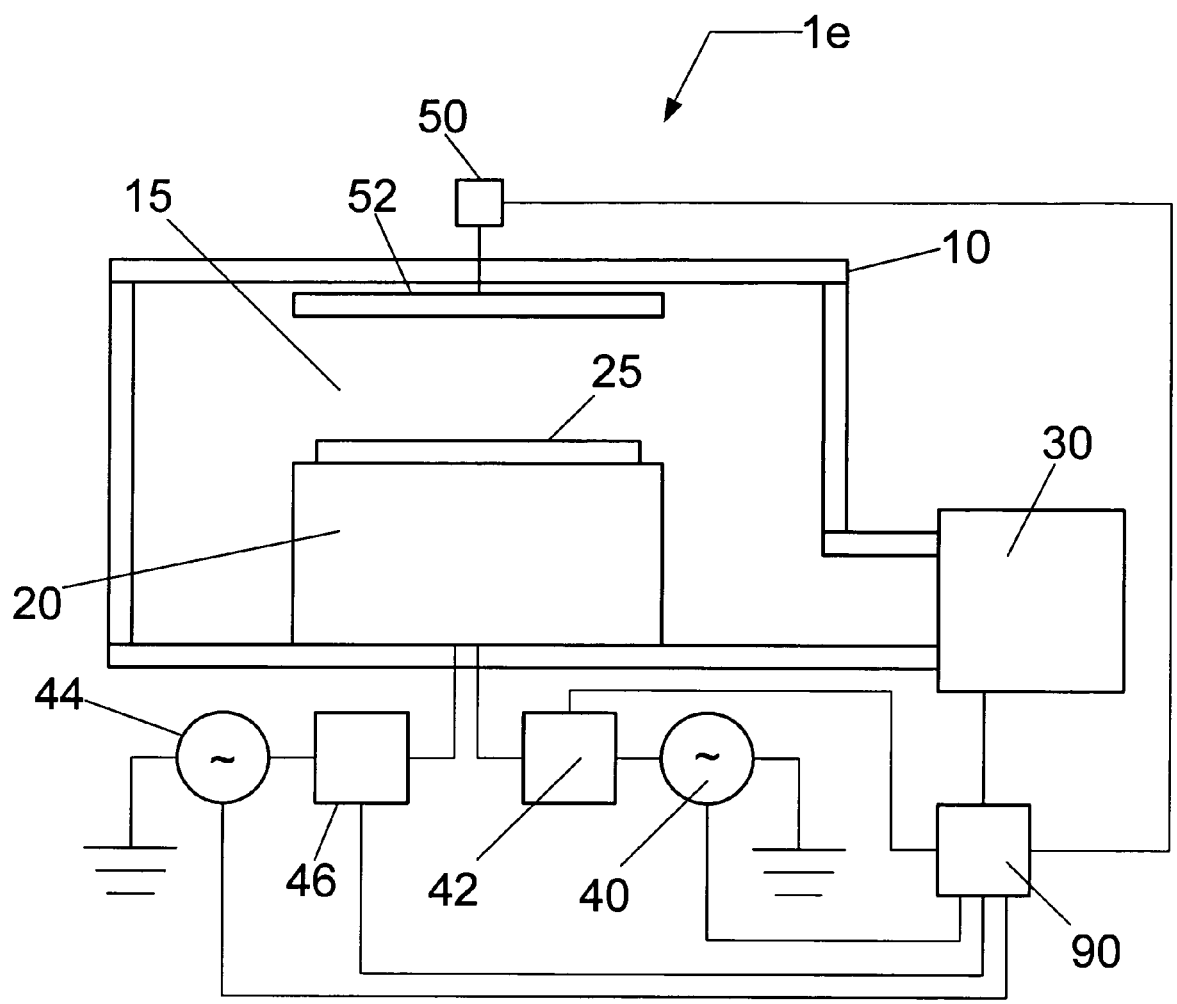
FIG. 8 shows a schematic diagram of a plasma processing system according to another embodiment of the invention.

In the embodiment shown in FIG. 8, the plasma processing system 1e can, for example, be similar to the embodiments of FIGS. 3, 4 and 5, and can further comprise a second RF generator 44 configured to couple RF power to substrate holder 20 through another optional impedance match network 46. A typical frequency for the application of RF power to substrate holder 20 can range from about 0.1 MHz to about 200 MHz for either the first RF generator 40 or the second RF generator 44 or both. The RF frequency for the second RF generator 44 can be relatively greater than the RF frequency for the first RF generator 40. Furthermore, the RF power to the substrate holder 20 from RF generator 40 can be amplitude modulated, or the RF power to the substrate holder 20 from RF generator 44 can be amplitude modulated, or both RF powers can be amplitude modulated. Desirably, the RF power at the higher RF frequency is amplitude modulated. Moreover, controller 90 is coupled to the second RF generator 44 and impedance match network 46 in order to control the application of RF power to substrate holder 20. The design and implementation of an RF system for a substrate holder is well known to those skilled in the art.

In the following discussion, a method of etching a thin film utilizing a plasma processing system with a ballistic electron beam is presented. For example, the plasma processing system can comprise various elements, such as described in FIGS. 1 through 8, and combinations thereof.

Figure 9:
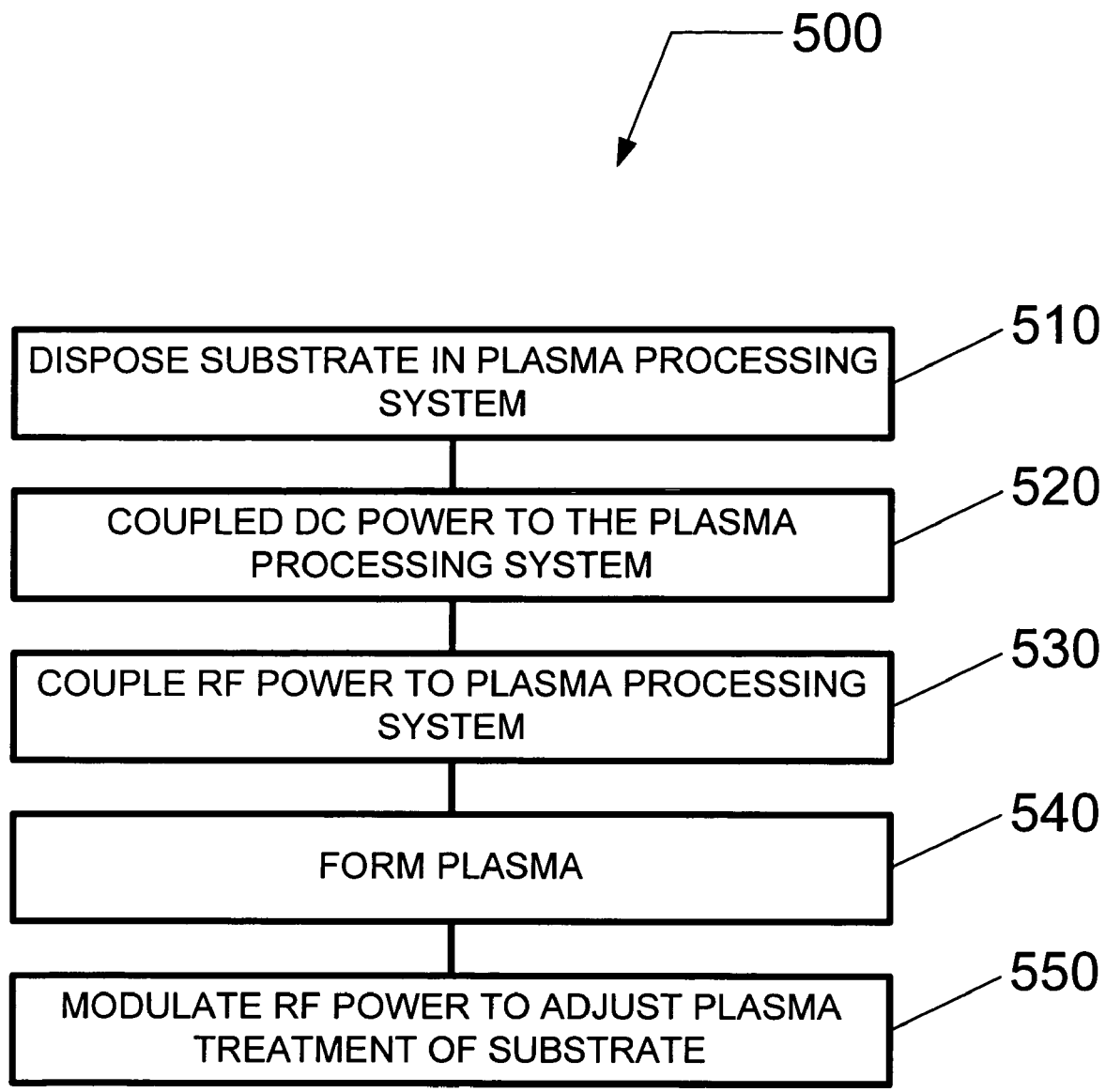
FIG. 9 illustrates a method of treating a substrate using plasma according to another embodiment of the invention.

FIG. 9 presents a flow chart of a method for etching a thin film using a plasma processing system having a ballistic electron beam according to an embodiment of the present invention. Procedure 500 begins at 510 with disposing a substrate in a plasma processing system configured to form both plasma and a ballistic electron beam.

In 520, DC power is coupled to the plasma processing system. For example, the DC voltage applied to the plasma processing system by a DC power supply may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than that is a self-bias voltage generated on an electrode surface of the plasma processing system.

In 530, RF power is coupled to the plasma processing system and, in 540, plasma is formed. In 550, the amplitude of the RF power is modulated in order to adjust the spatial distribution of the generated ballistic electron beam flux. The RF power can, for example, be modulated between approximately 100 W and 10000 W, and desirably, it can be modulated between approximately 400 W and approximately 5000 W. Additionally, the frequency of modulation can be varied between approximately 0.01 Hz and approximately 1 kHz. The amplitude modulation, the frequency of modulation, or the duty cycle for amplitude modulation, or a combination of two or more thereof may be varied in order to achieve a desirable distribution of electron beam flux or process result.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching a thin film on a substrate using a plasma processing system having a ballistic electron beam, comprising:
    disposing said substrate on a substrate holder in said plasma processing system;
    coupling direct current (DC) power to an electrode within said plasma processing system in order to create said ballistic electron beam from secondary electrons generated from ions bombarding said electrode during plasma generation;
    coupling alternating current (AC) power to said electrode having DC power coupled thereto and to said substrate holder, in order to form plasma in said plasma processing system;
    modulating two or more of a frequency, a duty cycle and an amplitude of said AC power to said electrode having DC power coupled thereto in order to control uniformity of the ions bombarding said electrode and thereby adjust the spatial distribution of said secondary electrons emitted from said electrode and the electron beam flux for said ballistic electron beam; and
    etching the thin film with the plasma and the ballistic electron beam having an adjusted spatial distribution of electron beam flux.

2. The method of claim 1, wherein said coupling DC power comprises coupling DC power ranging in voltage from −2000 V to 1000 V.

3. The method of claim 1, wherein said coupling DC power comprises coupling DC power having a negative polarity, wherein the absolute value of the DC voltage is greater than or equal to 500 V.

4. The method of claim 1, wherein said coupling DC power to said electrode comprises coupling DC power to an upper electrode opposing said substrate on said substrate holder.

5. The method of claim 4, wherein said coupling DC power to an upper electrode comprises coupling DC power to a silicon-containing electrode plate opposing said substrate on said substrate holder.

6. The method of claim 5, wherein said coupling DC power to a silicon-containing electrode plate comprises coupling DC power to a doped silicon electrode plate opposing said substrate on said substrate holder.

7. The method of claim 4, wherein said coupling AC power comprises coupling radio frequency (RF) power to said electrode or said substrate holder or both.

8. The method of claim 7, wherein said coupling RF power comprises coupling a first RF power to said upper electrode or said substrate holder at a first RF frequency and coupling a second RF power to said substrate holder at a second RF frequency, and wherein said first RF power is adjusted during said modulating.

9. The method of claim 8, wherein said second RF frequency is less than said first RF frequency.

10. The method of claim 1, wherein said coupling AC power comprises coupling radio frequency (RF) power to said electrode or said substrate holder or both.

11. The method of claim 10, wherein said modulating the amplitude of said AC power comprises modulating said RF power between an RF power level ranging from 100 W to 10000 W.

12. The method of claim 11, wherein said modulating said RF power comprises modulating said RF power at a modulation frequency ranging from 0.01 Hz to 1 kHz.

13. The method of claim 10, where said modulating the amplitude of said AC power comprises pulse modulating said RF power between a first RF power level and a second RF power level.

14. The method of claim 13, wherein said pulse modulating RF power comprises setting a duty cycle to define the fraction of time said plasma processing system is operated at said first RF power level and the fraction of time said plasma processing system is operated at said second RF power level.

15. The method of claim 1, further comprising:
    adjusting said modulating of AC power by varying one or more of the range of amplitude modulation, the frequency of amplitude modulation, or the duty cycle of amplitude modulation, or a combination of two or more thereof.

16. The method of claim 1, further comprising:
    forming plasma by coupling radio frequency (RF) power to an inductive coil.

17. The method of claim 1, further comprising:
    providing a magnetic field in the plasma processing system with a magnetic field system; and
    controlling the speed of rotation or the field strength of the magnetic field with a controller.

* * * * *